(12) United States Patent
Kavadia et al.

(10) Patent No.: US 11,724,690 B2
(45) Date of Patent: *Aug. 15, 2023

(54) ADVANCED PASSENGER SAFETY FOR AN AUTONOMOUS VEHICLE

(71) Applicant: GM CRUISE HOLDINGS LLC, San Francisco, CA (US)

(72) Inventors: Hemant Kavadia, San Francisco, CA (US); Nishant Sharma, San Francisco, CA (US); Abhishek Jain, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/515,953

(22) Filed: Nov. 1, 2021

(65) Prior Publication Data
US 2022/0055613 A1    Feb. 24, 2022

Related U.S. Application Data

(63) Continuation of application No. 16/410,444, filed on May 13, 2019, now Pat. No. 11,161,500.

(51) Int. Cl.
*B60W 30/08*   (2012.01)
*G05B 17/02*   (2006.01)
(Continued)

(52) U.S. Cl.
CPC ........ *B60W 30/08* (2013.01); *B60W 50/0097* (2013.01); *G05B 17/02* (2013.01);
(Continued)

(58) Field of Classification Search
CPC ............ B60W 30/08; B60W 50/0097; B60W 2050/0028; B60W 2400/00; B60W 2420/42; B60W 30/085; B60W 30/095; B60W 2540/049; B60W 2540/223; B60W 2540/227; B60W 60/0016; G05B 17/02;
(Continued)

(56) References Cited

U.S. PATENT DOCUMENTS

6,405,132 B1 *  6/2002  Breed ................. B60N 2/2863
                                                  701/45
7,124,027 B1 * 10/2006  Ernst, Jr. .............. B60W 30/09
                                                 701/301
(Continued)

*Primary Examiner* — Richard M Camby
(74) *Attorney, Agent, or Firm* — Novak Druce Carroll LLP (57) ABSTRACT

Systems and methods can improve passenger safety for an Autonomous Vehicle (AV) based on the integration of sensor data captured by the AV's interior and exterior sensors. The AV can determine passenger occupancy data corresponding to where each passenger is detected within the AV by the interior sensors. The AV can determine multiple sets of one or more driving actions that the AV can perform at a future time. The AV can generate crash impact data corresponding to where each passenger is detected from one or more simulated collisions between the AV and one or more objected detected by the exterior sensors when the AV performs one or more sets of driving actions from among the multiple sets. The AV can determine ranked sets of driving actions based on the passenger occupancy data and the crash impact data.

20 Claims, 6 Drawing Sheets

(51) Int. Cl.
  *G05D 1/00* (2006.01)
  *B60W 50/00* (2006.01)
  *G06T 7/70* (2017.01)
  *G06T 7/593* (2017.01)
  *G06F 30/20* (2020.01)
  *G06V 20/59* (2022.01)
  *B60R 11/04* (2006.01)
  *B60R 11/00* (2006.01)
  *H04N 23/698* (2023.01)

(52) U.S. Cl.
  CPC ........... *G05D 1/0088* (2013.01); *G06F 30/20* (2020.01); *G06T 7/593* (2017.01); *G06T 7/70* (2017.01); *G06V 20/593* (2022.01); *B60R 11/04* (2013.01); *B60R 2011/0003* (2013.01); *B60W 2050/0028* (2013.01); *B60W 2400/00* (2013.01); *B60W 2420/42* (2013.01); *G06T 2207/10012* (2013.01); *G06T 2207/30196* (2013.01); *G06T 2207/30268* (2013.01); *H04N 23/698* (2023.01)

(58) Field of Classification Search
  CPC ....... G05D 1/0088; G06F 30/20; G06F 30/15; G06F 30/27; G06T 7/593; G06T 7/70; G06T 2207/10012; G06T 2207/30196; G06T 2207/30268; G06V 20/593; G06V 40/161; B60R 11/04; B60R 2011/0003; H04N 5/23238
  See application file for complete search history.

(56) References Cited

U.S. PATENT DOCUMENTS

| | | | |
|---|---|---|---|
| 2003/0191568 A1* | 10/2003 | Breed | B60W 40/06 701/469 |
| 2007/0152804 A1* | 7/2007 | Breed | G01S 19/17 701/301 |
| 2008/0036580 A1* | 2/2008 | Breed | G01S 15/04 340/438 |
| 2013/0116859 A1 | 5/2013 | Ihlenburg et al. | |
| 2018/0208185 A1 | 7/2018 | Nagraj Rao et al. | |
| 2019/0286153 A1 | 9/2019 | Rankawat et al. | |
| 2020/0082248 A1 | 3/2020 | Villegas et al. | |
| 2020/0247357 A1 | 8/2020 | Wengreen et al. | |
| 2020/0307437 A1 | 10/2020 | Thieberger et al. | |

* cited by examiner

FIG. 6B

ADVANCED PASSENGER SAFETY FOR AN AUTONOMOUS VEHICLE

CROSS-REFERENCE TO RELATED APPLICATIONS

This application is a continuation of U.S. application Ser. No. 16/410,444, filed on May 13, 2019, entitled, ADVANCED PASSENGER SAFETY FOR AN AUTONOMOUS VEHICLE, which is hereby expressly incorporated by reference in its entirety.

TECHNICAL FIELD

The subject matter of this disclosure relates in general to the field of Autonomous Vehicles (AVs), and more particularly, to systems and method for improving safety for passengers of an AV.

BACKGROUND

An Autonomous Vehicle (AV) is a motorized vehicle that can navigate without a human driver. The AV can include a plurality of exterior sensor systems, such as one or more camera sensor systems, one or more Light Detection and Ranging (LIDAR) systems, and one or more Radio Detection and Ranging (RADAR) systems, among others. The AV may operate based upon sensor signals output by the exterior sensor systems. For example, the sensor signals can be provided to an internal computing system in communication with the plurality of exterior sensor systems and a processor can execute instructions based upon the sensor signals to control a mechanical system of the AV, such as a vehicle propulsion system, a braking system, a steering system, and so forth. While advancements have been made for the AV's exterior sensor systems, there has been little development of the AV's interior sensor systems and the integration of sensor data captured by the AV's interior and exterior sensor systems.

BRIEF DESCRIPTION OF THE FIGURES

To provide a more complete understanding of the present disclosure and features and advantages thereof, reference is made to the following description, taken in conjunction with the accompanying drawings, in which.

DETAILED DESCRIPTION

The detailed description set forth below is intended as a description of various configurations of embodiments and is not intended to represent the only configurations in which the subject matter of this disclosure can be practiced. The appended drawings are incorporated herein and constitute a part of the detailed description. The detailed description includes specific details for the purpose of providing a more thorough understanding of the subject matter of this disclosure. However, it will be clear and apparent that the subject matter of this disclosure is not limited to the specific details set forth herein and may be practiced without these details. In some instances, structures and components are shown in block diagram form in order to avoid obscuring the concepts of the subject matter of this disclosure.

The present technology can involve the gathering and use of data available from various sources to improve quality and experience. The present disclosure contemplates that in some instances, this gathered data may include personal information. The present disclosure contemplates that the entities involved with such personal information respect and value privacy policies and practices.

There is no algorithm, no amount of processing, and no precautionary action that an Autonomous Vehicle (AV) can take to prevent traffic accidents at all times in a world with human drivers, vehicles with mechanical parts that are subject to wear and tear, and other unpredictable externalities. Much of the effort in development of AV technology focuses on improving external sensor systems and ensuring that the AV avoids collision while little to no thought has been put into collision mitigation. However, traffic accidents are inevitable. For example, an AV can abide by all traffic laws, engage in best practices for driver safety, and take every safety precaution but there may be nothing the AV can do to avoid a collision when another car suddenly veers into the AV's lane, another car runs a red light or stop sign while the AV traverses an intersection, another car driving in the opposite direction of a two-way street drifts into oncoming traffic and into the AV, and so forth. Conventional AVs may not be equipped to handle these circumstances.

Various embodiments of the present disclosure can overcome the above and other deficiencies of the prior art. In particular, systems and methods can improve AV passenger safety based on the integration of sensor data captured by the AV's interior and exterior sensors. For example, the AV can determine passenger occupancy data corresponding to where each passenger, if any, is seated within the AV based on sensor data captured by the interior sensors. The AV can determine multiple sets of one or more driving actions that the AV can take at a future time. The AV can generate crash impact data corresponding to where each passenger is seated from one or more simulated collisions occurring between the AV and one or more objects detected based on sensor data captured by the exterior sensors. For example, the AV can determine the Principal Directions of Force (PDOF) of a simulated collision predicted to occur if the AV performs a particular set of driving actions from among the multiple sets. Alternatively or in addition, the AV can determine crash or injury severity metrics, such as the Vehicle change in velocity (Delta-V), Occupant Impact Velocity (OIV), Occupant Load Criterion (OLC), Acceleration Severity Index (ASI), Vehicle Pulse Index (VPI), Abbreviated Injury Scale (AIS), Injury Severity Score (ISS), and so forth, for where each passenger is seated upon a collision if the AV performs a particular set of driving actions from among the multiple sets.

The AV can determine first ranked sets of one or more driving actions from among the multiple sets based on the passenger occupancy data and the crash impact data, such as ranked sets that avoid or mitigate the Principal Direction of Force (PDOF) of a collision corresponding to where each passenger is seated and/or ranked sets that minimize the crash or injury metrics corresponding to where each passenger is seated. In some embodiments, the AV can select a highest ranking set from among the first ranked sets when the AV determines that a collision is unavoidable at the future time. Otherwise, the AV 102 can perform one of the sets of driving actions predicted not to result in a collision (e.g. a second ranked set, a randomly selected set, etc.).

Figure 1:
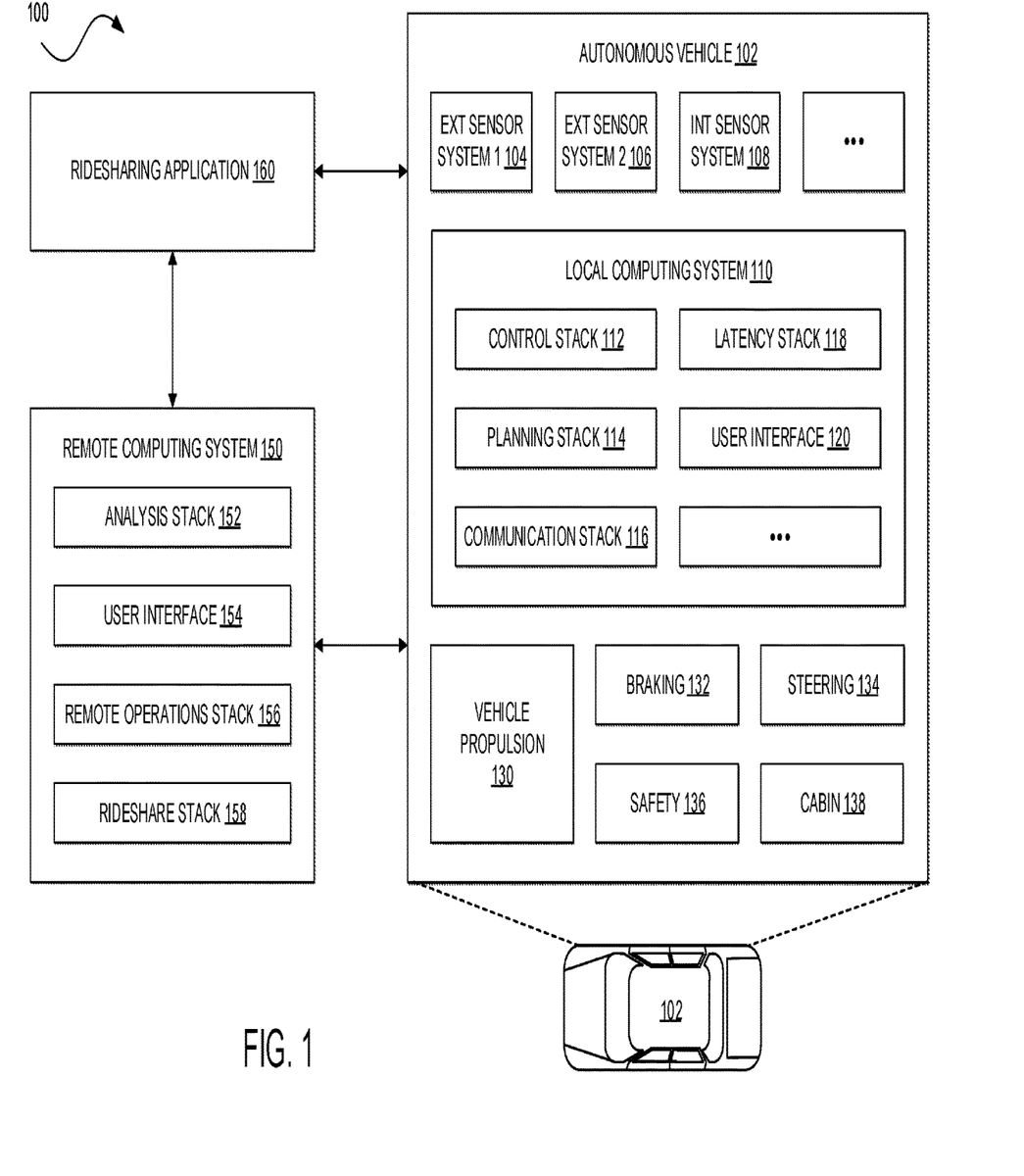
FIG. 1 illustrates an example of a system for an Autonomous Vehicle (AV) ridesharing service in accordance with an embodiment.

Turning now to the drawings, FIG. 1 illustrates an example of a system for an AV ridesharing service 100. One of ordinary skill in the art will understand that, for the AV ridesharing service 100 and any system discussed in the present disclosure, there can be additional or fewer components in similar or alternative configurations. The illustrations and examples provided in the present disclosure are for conciseness and clarity. Other embodiments may include different numbers and/or types of elements but one of ordinary skill the art will appreciate that such variations do not depart from the scope of the present disclosure.

In general, the AV ridesharing service 100 is a dispatching system and user-to-vehicle matching solution designed to provide ridesharing, delivery (e.g., documents, packages, food, etc.), and similar services via a fleet of AVs. In this example, the AV ridesharing service 100 includes an AV 102, a remote computing system 150, and a ridesharing application 160. The AV 102, the remote computing system 150, and the ridesharing application 160 can communicate with each other over one or more networks, such as a public network (e.g., a public cloud, the Internet, etc.), a private network (e.g., a local area network, a private cloud, a virtual private network, etc.), and/or a hybrid network (e.g., a multi-cloud or hybrid cloud network, etc.).

The AV 102 can navigate about roadways without a human driver based on sensor signals generated by multiple sensor systems 104, 106, and 108. The sensor systems 104-108 can include different types of sensors and can be arranged about the AV 102. For instance, the sensor systems 104-108 can comprise Inertial Measuring Units (IMUs) (e.g., accelerometers, gyroscopes, magnetometers, etc.), image sensors (e.g., still image cameras, video cameras, etc.), light sensors (e.g., LIDAR systems, ambient light sensors, infrared sensors, etc.), Global Positioning System (GPSs), RADAR systems, audio sensors (e.g., microphones, Sound Navigation and Ranging (SONAR) systems, ultrasonic sensors, etc.), speedometers, tachometers, odometers, altimeters, tilt sensors, impact sensors, seat occupancy sensors, open/closed door sensors, temperature sensors, pressure sensors, rain sensors, and so forth. In this example, the sensor system 104 can be a first image sensor system (e.g., LIDAR) for the exterior of the AV, the sensor system 106 can be a second image sensor system (e.g., still image or video cameras) for the exterior of the AV, and the sensor system 108 can be an image sensor system (e.g., still image or video cameras) for the interior of the AV. Other embodiments may include any other number and type of sensors.

The AV 102 can also include several mechanical systems that can be used to maneuver or operate the AV 102. For instance, the mechanical systems can include a vehicle propulsion system 130, a braking system 132, a steering system 134, a safety system 136, and a cabin system 138, among other systems. The vehicle propulsion system 130 can include an electric motor, an internal combustion engine, or both. The braking system 132 can include an engine brake, brake pads, actuators, and/or any other suitable componentry configured to assist in decelerating the AV 102. The steering system 134 can include suitable componentry configured to control the direction of movement of the AV 102 during navigation. The safety system 136 can include lights and signal indicators, a parking brake, airbags, and so forth. The cabin system 138 can include cabin temperature control systems, in-cabin entertainment systems, and so forth. In some embodiments, the AV 102 may not include human driver actuators (e.g., steering wheel, handbrake, foot brake pedal, foot accelerator pedal, turn signal lever, window wipers, etc.) for controlling the AV 102. Instead, the cabin system 138 can include one or more client interfaces (e.g., Graphical User Interfaces (GUIs), Voice User Interfaces (VUIs), etc.) for controlling certain aspects of the mechanical systems 130-138.

The AV 102 can additionally include a local computing system 110 that is in communication with the sensor systems 104-108, the mechanical systems 130-138, the remote computing system 150, and the ridesharing application 160, among other systems. The local computing system 110 can include one or more processors and memory including instructions that can be executed by the one or more processors. The instructions can make up one or more software stacks or systems responsible for controlling the AV 102, communicating with the remote computing system 150, the ridesharing application 160, and other systems, receiving inputs from users, logging metrics collected by the sensor systems 104-108 and users, and so forth. In this example, the local computing system 110 includes a control stack 112, a planning stack 114, a communication stack 116, a latency stack 118, and a user interface 120, among other stacks and systems.

The control stack 112 can manage the operation of the vehicle propulsion system 130, the braking system 132, the steering system 134, the safety system 136, and the cabin system 138. The control stack 112 can receive sensor signals from the sensor systems 104-108 as well as communicate with other stacks of the local computing system 110 to effectuate operation of the AV 102. In some embodiments, the control stack 112 may carry out operations in concert with one or more other stacks or systems of the AV 102.

The planning stack 114 can determine how to maneuver or operate the AV 102 safely in its environment. For example, the planning stack 114 can be provided with the location, speed, and direction of the AV 102, map or route information, data regarding objects sharing the road with the AV 102 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 102 from one point to another. The planning stack 114 can determine multiple sets of one or more driving actions that the AV 102 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 114 can select from multiple backup plans to carry out. For example, while preparing to change lanes to turn right at an intersection, another vehicle may aggressively cut into the destination lane, making the lane change unsafe. The planning stack 114 would have already determined an alternative plan for such an event, and upon the event occurring, help to direct the AV 102 to go around the block instead of blocking its current lane while waiting for an opening to change lanes. In some embodiments, the planning stack 114 can be a part of the control stack 112.

The communication stack 116 can transmit and receive signals between the stacks and systems of the AV 102 and between the AV 102 and the remote computing system 150, the ridesharing application 160, and other remote systems. The communication stack 116 can enable the local computing system 110 to exchange information remotely over a network, such as through an antenna array or interface that can provide municipal Wi-Fi, cellular (e.g., Third Generation (3G), Fourth Generation (4G), Long-Term Evolution (LTE), 5th Generation (5G), etc.), or other wireless Wide Area Network (WAN) or remote connection. The communication stack 116 can also facilitate local exchange of information, such as through a wired connection (e.g., a user's mobile computing device docked in an in-car docking station or connected via Universal Serial Bus (USB), the local computing system 110, etc.) or a local wireless connection (e.g., Wireless Local Area Network (WLAN), Bluetooth®, infrared, etc.). In some embodiments, the communication stack 116 can be configured to exchange information locally when a user's mobile computing device is within a certain range of the AV 102. For example, when the user's mobile computing device is located within a certain range of the AV 102, the AV 102 can configure the user's device (e.g., via the ridesharing application 160) and/or the local computing system 110 to use a local connection to more directly communicate with the AV 102. This can reduce latency that may otherwise accrue by exchanging information over a remote network connection, reduce bandwidth usage and utilization of other computing resources (e.g., processing, memory, storage, power, etc.) that may otherwise be consumed for enabling remote connectivity, and increase security and dependability by foregoing remote networking, among other advantages.

The latency stack 118 can utilize timestamps on communications to and from the remote computing system 150 to determine if a communication has been received from the remote computing system 150 in time to be useful. For example, when a stack of the local computing system 110 requests feedback from the remote computing system 150 on a time-sensitive basis, the latency stack 118 can determine if a response was timely received from the remote computing system 150 as information can quickly become too stale to be actionable. When the latency stack 118 determines that a response has not been received within a threshold, the latency stack 118 can enable other stacks or systems of the AV 102 or a user to make necessary decisions or to provide the needed feedback.

The user interface 120 can exchange information with a user for how to operate the AV 102. In some embodiments, the user may be asked to evaluate and override an AV-selected set of driving actions determined by the planning stack 114, or the user may wish to provide an instruction to the AV 102 regarding destinations, requested routes, or other requested operations. The user interface 120 can be provided locally via the local computing system 110 and/or the ridesharing application 160 executing on a passenger's mobile computing device and/or remotely via the remote computing system 150 and/or the ridesharing application 160 executing on a remote user's computing device.

The remote computing system 150 can send and receive various signals to and from the AV 102. These signals can include reporting data for training and evaluating machine learning algorithms, requesting assistance from the remote computing system 150 or a human operator via the remote computing system 150, software stack updates, ridesharing pick-up and drop-off instructions, and so forth. In this example, the remote computing system 150 includes an analysis stack 152, a user interface 154, a remote operations stack 156, and a ridesharing service stack 158, among other stacks and systems.

The analysis stack 152 can receive data from the AV 102 and analyze the data to train or evaluate machine learning algorithms for operating the AV 102. The analysis stack 152 can also perform analysis pertaining to data associated with one or more errors or constraints reported by the AV 102.

The user interface 154 can present metrics, video, pictures, sounds, and so forth that are reported from the AV 102 to a human operator of the remote computing system 150. The user interface 154 can further receive input instructions from a human operator that can be sent to the AV 102.

The remote operations stack 156 can generate and transmit instructions regarding the operation of the AV 102. For example, in response to an output of the analysis stack 152 or the user interface 154, the remote operations stack 156 can prepare instructions for one or more stacks or systems of the AV 102.

The ridesharing service stack 158 can interact with the ridesharing application 160 operating on client computing devices, such as computing servers, desktops, laptops, tablets, smartphones, smart wearable devices (e.g., smart watches, smart eyeglasses or other Head-Mounted Displays (HMDs), smart ear pods or other smart in-ear, on-ear, or over-ear devices, etc.), gaming systems, or other general purpose computing devices. The client computing devices may be users' mobile computing devices or computing devices integrated with the AV 102 (e.g., the local computing system 110). The ridesharing service stack 158 can receive requests to be picked up or dropped off from the ridesharing application 160 and dispatch the AV 102 for the trip. The ridesharing service stack 158 can also act as an intermediary between the ridesharing application 160 and the AV 102 when a user provides instructions to the AV 102 to go around an obstacle, change routes, honk the horn, and so forth.

Figure 2:
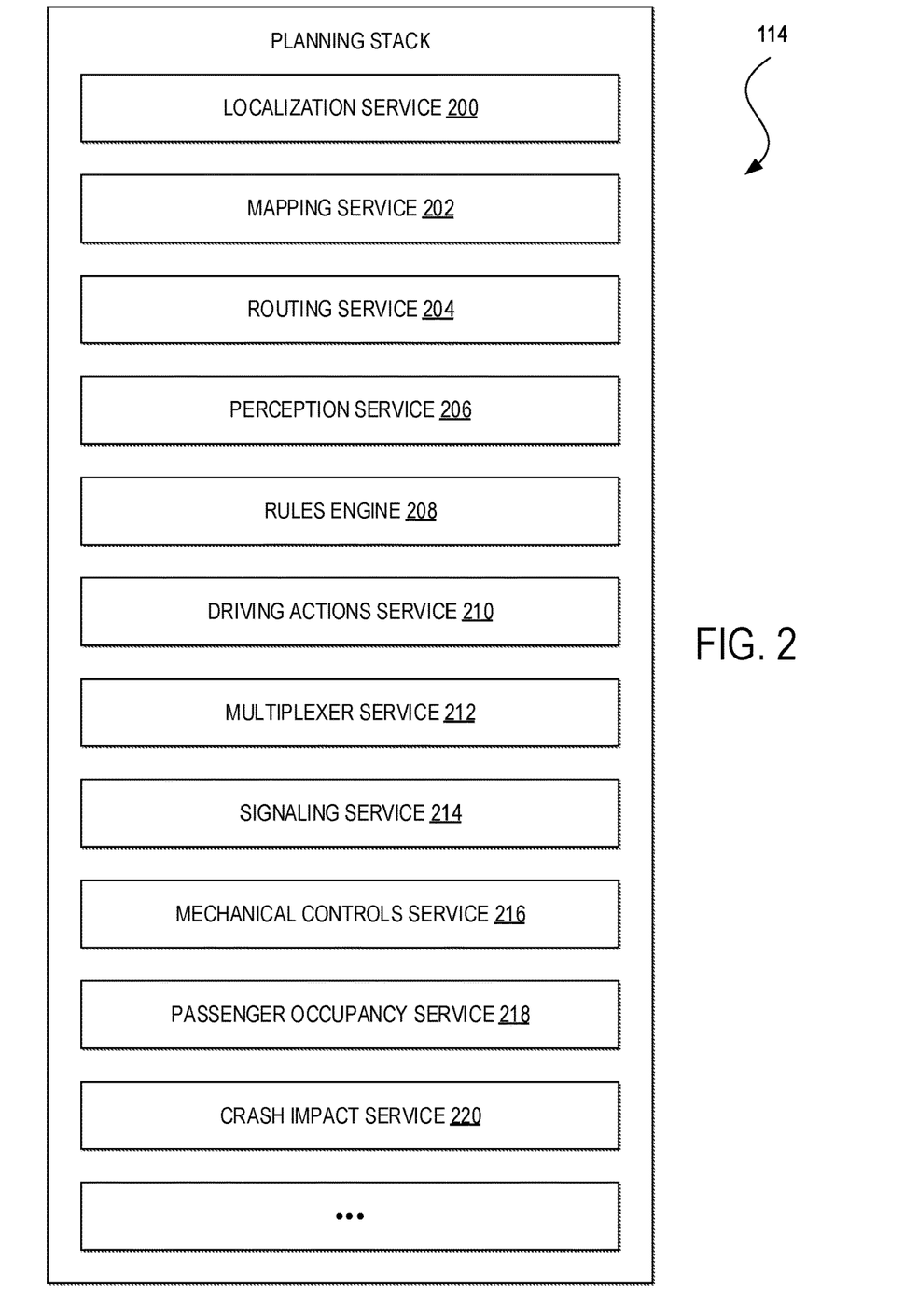
FIG. 2 illustrates an example of a planning stack for an AV in accordance with an embodiment.

FIG. 2 illustrates an example of the planning stack 114. One of ordinary skill in the art will understand that the services and other elements of the planning stack 114 may depend from, integrate with, or extend other stacks or systems of the AV 102. In addition, the planning stack 114 is but one example for implementing planning for the AV 102, and one of ordinary skill in the art will understand how to apply the general principles disclosed herein to other embodiments without departing from the scope of the present disclosure.

At a high level, the planning stack 114 can determine the desired behavior for the AV 102 in its current environment. The planning stack 114 may identify the sets of driving actions that need to be conducted to navigate the AV 102 from one point to another. The planning stack 114 may have knowledge of the geographical location of the AV 102, the rules of the road, and how to interpret information about traffic controls, road markings, and so on. The planning stack 114 can integrate the dynamic world with the known mapped world into directives that ensure the AV 102 is controlled in a collision-free, safe, and efficient manner. To this end, the planning stack 114 can include a localization service 200, a mapping service 202, a routing service 204, a perception service 206, a driving actions service 210, a multiplexer service 212, a signaling service 214, a mechanical controls service 216, a passenger occupancy service 218, and a crash impact service 220, among other services or elements.

The localization service 200 can determine the AV's location, speed, direction, and the like from the sensor systems 104 and 106 (e.g., GPS, cameras, LIDAR, RADAR, IMUs, speedometer, tachometer, etc.) and/or other data sources. For example, if the localization information from one system is unavailable, the AV 102 can use localization information from a redundant system and/or from other sources (e.g., a cellular network, a Wi-Fi network, etc.).

The mapping service 202 can maintain high-definition maps of the roads upon which the AV 102 travels, including the type of road (e.g., highway, one-way road, street, etc.), road infrastructure (e.g., sidewalks, traffic lights, traffic signs, tolls, etc.), lane information (e.g., number of lanes, carpool lane, High Capacity Transit (HCT) lane, bicycle lane, etc.), road grade and slope, and the like. The mapping service 202 can also maintain information regarding undriveable areas (e.g., areas with no roads, areas outside the boundaries of the AV ridesharing service 100, etc.). In addition, the mapping service 202 can exchange updates regarding traffic conditions (e.g., congestion, accidents, construction detours, etc.), road infrastructure conditions (e.g., potholes, road kill, roads requiring fresh striping, defaced stop signs, non-functional traffic lights, etc.), and so forth with other AVs, the remote computing system 150, the ridesharing application 160, and the like.

The routing service 204 can select the best possible lane-specific route that the AV 102 can take to a destination, such as a pick-up or drop-off location, a refueling or recharging station, a parking spot, and so forth.

The perception service 206 can enable the AV 102 to "see" (e.g., via cameras, infrared sensors, LIDAR, etc.), "hear" (e.g., via microphones, ultrasonic sensors, etc.), and "feel" (e.g., RADAR, pressure sensors, force sensors, impact sensors, etc.) its environment based on sensor data from the exterior sensor systems 104 and 106. The perception service 206 can detect and classify objects and events (e.g., other vehicles, blockages, bicycles, emergency vehicles, traffic lights, pedestrians, buses, trains, trolleys, etc.) to determine their current and predicted locations, speeds, directions, and the like. In addition, the perception service 206 can determine the free space around the AV 102 to maintain a safe distance from other objects, change lanes, park the AV 102, and so forth. The perception service 206 can also identify environmental uncertainties, such as where to look for moving objects, flag areas that may be obscured or blocked from view, and so on.

The rules engine 208 can comprise various driving and safety rules by which the AV 102 may adhere, such as traffic laws, safety standards, collision avoidance rules, AV ridesharing service objectives (e.g., fuel or battery efficiency, maximizing utilization of the AV 102 fleet, maximizing the number of trips, maximizing fares, etc.), trip conditions (e.g., maximum trip time, maximum trip fare, minimum distance from a refueling or recharging station, etc.), and so forth.

The driving actions service 210 can determine multiple sets of one or more driving operations the AV 102 can perform for one or more future time intervals based on data from the localization service 200, the mapping service 202, the routing service 204, the perception service 206, the rules engine 208, the signaling service 214, and so on. For example, if the AV 102 is in the right lane of a two-way street with two lanes on each side of the street driving at the speed limit and the routing service 204 determines the best route involves making a left turn at the next intersection, the sets of driving actions can include turning left at the next intersection (e.g., turning on the left blinker, changing to the left lane, decelerating, and turning left at the next intersection), staying in the current lane at a specified rate of acceleration (e.g., including accelerating, maintaining the same speed, or decelerating), or turning right at the next intersection to take an alternative route (e.g., turning on the right blinker, decelerating, and turning right), and so on.

If the perception service 206 detects another vehicle in the left lane traveling at the speed limit and the rules engine 208 specifies that the AV 102 cannot exceed the speed limit and must maintain a threshold distance when following another vehicle at the other vehicle's current speed, the sets of driving actions may include turning left at the next available intersection (e.g., turning on the left blinker, decelerating until the other vehicle is the threshold distance ahead of the AV 102, changing to the left lane, and turning left at the next available intersection), staying in the current lane at a specified right of acceleration, turning right at the next intersection, and so forth. Other embodiments may utilize sets of driving actions of different granularities, including sets of driving actions of coarser granularity (e.g., travel north, south, east, or west) or finer granularity (e.g., turning the steering system 134 by five degrees to the left and traveling at a first specified speed for one second, turning the steering system 134 by an additional five degrees to the left and traveling at a second specified speed at the next second, etc.).

When the driving actions service 210 determines there are multiple sets of driving actions that are safe, legal, and otherwise valid to perform, the multiplexer service 212 can select one of the multiple sets of driving actions for the AV 102 to actually perform. For example, the multiplexer service 212 can determine a ranking for the multiple sets of driving actions based on preferences set forth in the rules engine 208, such as lane preferences, route preferences, the goals of the AV ridesharing service, user preferences for a trip, and so forth.

The AV 102 can trigger the signaling service 214 in anticipation of certain sets of driving actions or confirm a signaling state before performing certain sets of driving actions. For example, the signaling service 214 can engage the AV's turn signals when the multiplexer service 212 elects to make a turn, change lanes, pullover the AV 102, and so forth.

The mechanical controls service 216 can convert the set of driving actions selected by the multiplexer service 212 to commands for the actuators that control the vehicle propulsion system 130, the braking system 132, the steering system 134, the safety system 136, the cabin system 138, and so forth. The mechanical controls service 216 can also ensure full vehicle maneuverability complete with stability, traction, and anti-lock brake systems fully active.

Conventional AVs may be prohibited from taking illegal driving actions, driving actions resulting in a collision, or other invalid driving actions. This can leave the conventional AV with no possible action to take in the event of a collision or cause the conventional AV to take an action that may be more harmful to passengers than other possible actions. Various embodiments of the present disclosure can improve upon conventional AVs by considering all possible driving actions the AV can take, evaluating the effects of those actions with respect to where passengers are seated in the AV, and determining the sets of driving actions that maximize passenger safety, such as sets of driving actions that avoid the PDOF of a collision corresponding to where passengers may be seated or sets of driving actions that minimize crash or injury metrics corresponding to where passengers may be passengers seated.

Thus, in some embodiments, the AV 102 can include the passenger occupancy service 218 and the crash impact service 220. The passenger occupancy service 218 can evaluate sensor data (e.g., image/video, audio, weight, pressure, seat belt tension, etc.) captured by the interior sensor system 108 to determine whether passengers occupy any of the seats of the AV 102 and, if so, which of the seats are occupied. For example, the passenger occupancy data can be a 1×n array where n can represent the number of seats of the AV 102, 0's can indicate that a seat is unoccupied, and 1's can indicate that a seat is occupied with a passenger. Alternatively, the AV 102 may utilize a more complex encoding for the passenger occupancy data, such as more granular position data (e.g., two-dimensional or three-dimensional bounding box data, full mesh body model data, etc.). In some embodiments, the passenger occupancy service 218 can also capture demographic traits of passenger that may be relevant to determining the effects of a collision, such as age, gender, height, weight, and so on. In some embodiments, the passenger occupancy service can also capture state data regarding where passengers are seated, such as whether a passenger has a seatbelt on, whether and to what extent the passenger's seat is reclined, and so forth. The passenger occupancy service 218 is discussed in further detail with respect to FIGS. 3A-3D, FIG. 4, and elsewhere in the present disclosure.

When the driving actions service 210 determines that collision is unavoidable at a future time, the crash impact service 220 can generate crash impact data by simulating one or more collisions occurring at the future time between the AV 102 and the objects detected by the perception service 206 when taking one or more of the multiple sets of driving actions determined by the driving actions service 210 and where the passenger occupancy service 218 determines passengers may be seated in the AV 102. The crash impact service 220 can provide the crash impact data to the multiplexer service 212, and the multiplexer service 212 can determine ranked sets of the driving actions that will most likely result in the least amount of harm to the passengers where they are seated within the AV 102. Various approaches can be used to quantify the most safe or least harmful sets of driving actions. In some embodiments, the sets of driving actions can be ranked so as to avoid or mitigate the Principal Direction of Force (PDOF) of a collision corresponding to where each passenger is seated. For example, if the passenger occupancy service 218 determines that only the backseat on the right side of the AV 102 is occupied by a passenger, the multiplexer service 212 may determine, in order of preference, sets of driving actions predicted to result in a collision to the front left quadrant of the AV 102, sets of driving actions predicted to result in collisions to the front right quadrant and rear left quadrant of the AV 102, and sets of driving actions predicted to result in a collision to the rear right quadrant of the AV 102. Other embodiments may alternatively or additionally utilize different locations of the AV 102 (e.g., full frontal, right offset, left offset, left offset oblique, right offset oblique, front to left corner, right offset oblique, front to right offset oblique, left full oblique, right full oblique, drive side, left side; front left door, front right door, rear left door, rear right door; etc.)

Alternatively or in addition, the multiplexer service 212 can rank the multiple sets of driving actions based on crash or injury severity metrics determined by the crash impact service 220 for each location of the AV 102 where a passenger is seated. Some examples of vehicle-based crash severity metrics include Vehicle change in velocity (Delta-V), Occupant Impact Velocity (OIV), Occupant Load Criterion (OLC), Acceleration Severity Index (ASI), Vehicle Pulse Index (VPI), and so on. Some examples of injury severity metrics include Abbreviated Injury Scale (AIS), Injury Severity Score (ISS), Head Injury Criterion (HCI), chest acceleration, peak chest displacement, peak pelvic acceleration, and so forth.

Some examples of tools for determining the PDOF or crash or injury severity metrics of simulated collisions include EDCRASH™ or EDSMAC™ from Engineering Dynamics Corporation®, WinSMASH from the National Highway Traffic Safety Administration, LS-DYNA® from Livermore Software Technology® Corporation, PAM-CRASH® from ESI Group®, PC-Crash™ from MEA Forensic®, Dytran® from MSC Software® Corporation, and MADYMO® from TASS International®, among other crash simulation tools known to those of ordinary skill in the art.

FIGS. 3A-3D illustrate examples of configurations of interior sensor systems 108A-C (collectively, 108) for the AV 102. Although the interior sensor systems comprise cameras or other image sensors here, other embodiments may include interior sensor systems having other types of sensors that may be used instead or that may be combined with one another for determining passenger occupancy. One of ordinary skill in the art will know how to apply the general principles disclosed herein to these other embodiments without departing from the scope of the present disclosure.

Figure 3A:
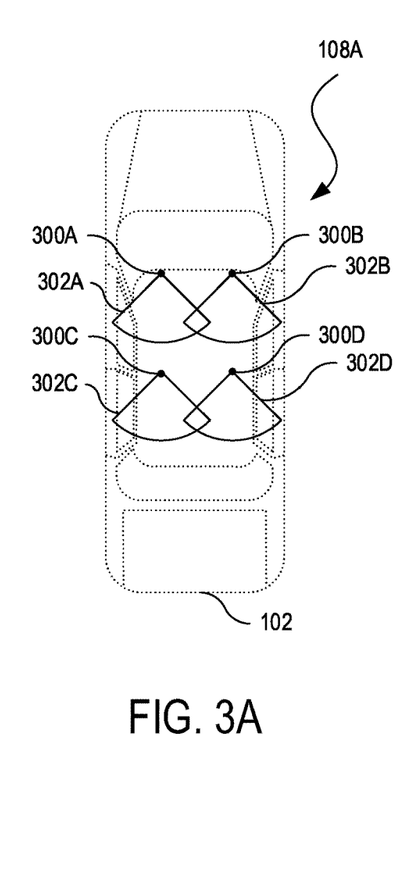
FIGS. 3A-3D illustrate examples of configurations of interior sensor systems for an AV in accordance with some embodiments.

FIG. 3A illustrates an example of a first configuration of an interior sensor system 108A for the AV 102. The interior sensor system 108A can include four cameras 300A, 300B, 300C, and 300D (collectively, 300) each having standard angles of view 302A, 302B, 302C, and 302D, respectively (e.g., between 30 and 60 degrees). Each of the cameras 300 may be positioned to capture image data of a seat of the AV 102 so that the AV 102 may determine whether a passenger occupies the seat. In this example, the cameras 300A and 300B may be disposed toward the front of the AV 102, such as where a dashboard would be located on a conventional vehicle. The cameras 300C and 300D may be disposed on the back side of headrests for the front seats of the AV, as discussed in further detail with respect to FIG. 3B.

In some embodiments, three-dimensional or stereoscopic image information can be captured using multiple cameras to provide three-dimensional point data, or disparity information that can be used to detect and track objects. The amount of disparity can be inversely proportional to the distance from the cameras, such that there can be significantly more disparity in the near camera field, e.g., 0 to 1.0 m, than in the far field, e.g., 1.0 m to infinity. Further, the decrease may not be linear. However, objects decrease more quickly near the camera than at a distance, as objects in the distance can have little to no disparity regardless of whether they are twenty feet away or a mile away. An approach in accordance with various embodiments can determine the distance to an object or feature based on the amount of stereo disparity for the object between two images captured by the pair of cameras. For example, a passenger's face may typically be located at arm's length from the cameras. By examining a disparity relationship curve or relationship, the AV can determine that the amount of disparity for the configuration parameters of the cameras, e.g., resolution, camera separation, or field of view is twenty five pixels of separation between images. Using this information, the device can analyze matching feature points, e.g., nose, eyes, or fingertips, in the stereo images, and determine the approximate distance between those feature points and the cameras. For example, the amount of disparity, D, at a given distance, z, can be represented by the relationship:

$$D = \frac{f * B}{z} \quad \text{(Equation 1)}$$

where f is the focal length of each of the matched cameras and B is the baseline, or distance between the viewpoints of the cameras based at least in part upon their relative positions and separation. For example, if the focal length of a camera is four hundred pixels and the baseline is five centimeters, for a distance of one meter the disparity would be twenty pixels. Based on relationships such as this one, the AV 102 may be able to determine the distance between the passengers and the cameras 300. Various other approaches can be utilized as well as should be apparent to one of ordinary skill in the art in light of the teachings and suggestions contained herein. For example, other approaches for determining a distance between an object of interest and the device can include using time-of-flight cameras or structured light cameras. A time-of-flight camera is a range imaging camera system that determines a distance of an object from the camera based on the known speed of light. For example, the camera can measure the time-of-flight of a light signal between the camera and the object for each point of an image of the object. A structured light camera is a three-dimensional scanning device used for measuring the three-dimensional shape of an object using projected light patterns and a camera.

Figure 3B:
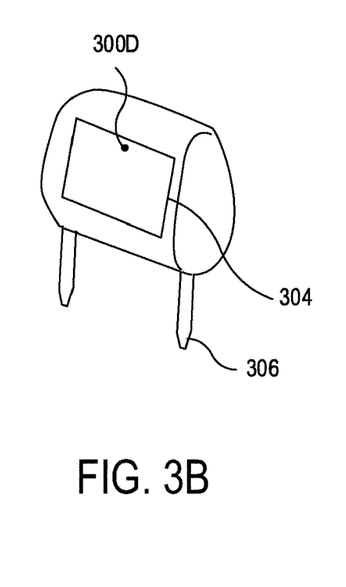

FIG. 3B illustrates an example of a configuration for the camera 300D. The camera 300D may be integrated with a tablet computer 304 or other computing device with a touchscreen. The tablet computer 304 may be embedded on the back side of a headrest 306 of the right front seat of the AV 102.

Figure 3C:
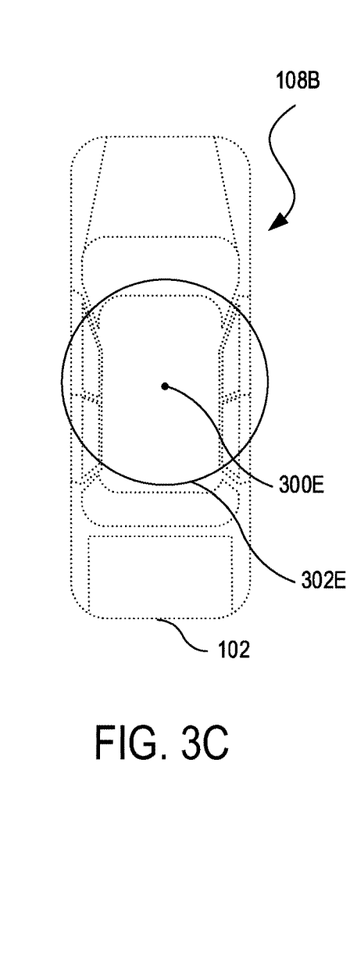

FIG. 3C illustrates an example of a second configuration of an interior sensor system 108B for the AV 102. The interior sensor system 108B can include one or more cameras 300E having an approximately 360 degree angle of view 302E of the interior of the AV 102. The interior sensor system 108B can comprise a single camera having a fish eye lens mounted to the ceiling of the interior of the AV 102 and disposed toward the center of the ceiling. Alternatively, the interior sensor system 108B can comprise multiple cameras arranged to capture a 360 degree view of the interior of the AV 102 and one or more processors for stitching together 360 degree image information from the multiple cameras.

Figure 3D:
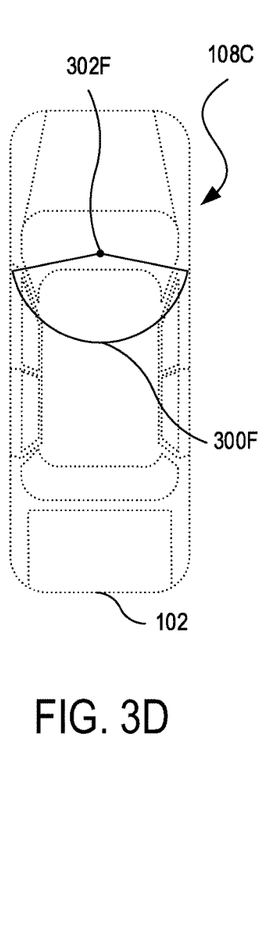

FIG. 3D illustrates an example of a third configuration of an interior sensor system 108C for the AV 102. The interior sensor system 108C can include one or more cameras 300F having an approximately 180 degree angle of view 302F of the interior of the AV 102. The interior sensor system 108C can comprise a single camera having an ultra-wide angle or fisheye lens mounted on where a dashboard would be located on a conventional vehicle and disposed towards the center of the dashboard. Alternatively, the interior sensor system 108C can comprise multiple cameras arranged to capture a 180 degree view of the interior of the AV 102 and one or more processors for stitching together 180 degree image information from the multiple cameras 300. In other embodiments, the one or more cameras may be disposed toward a center of a rear end of the AV 102 (e.g., between the backseat passenger seats and mounted on the ceiling or on the rear windshield of the AV) to capture the backs of the heads of any passengers.

In some embodiments, the AV 102 can include exterior cameras that are capable of capturing image data of the interior of the AV. For example, the exterior cameras can utilize wide angle (e.g., between 60 and 80), ultra wide angle (e.g., between 80 and 120), or fisheye lenses (e.g., 180 degrees and greater) and/or may be integrated with motors to place the cameras in positions to capture the image data of the interior of the AV 102.

Figure 4:
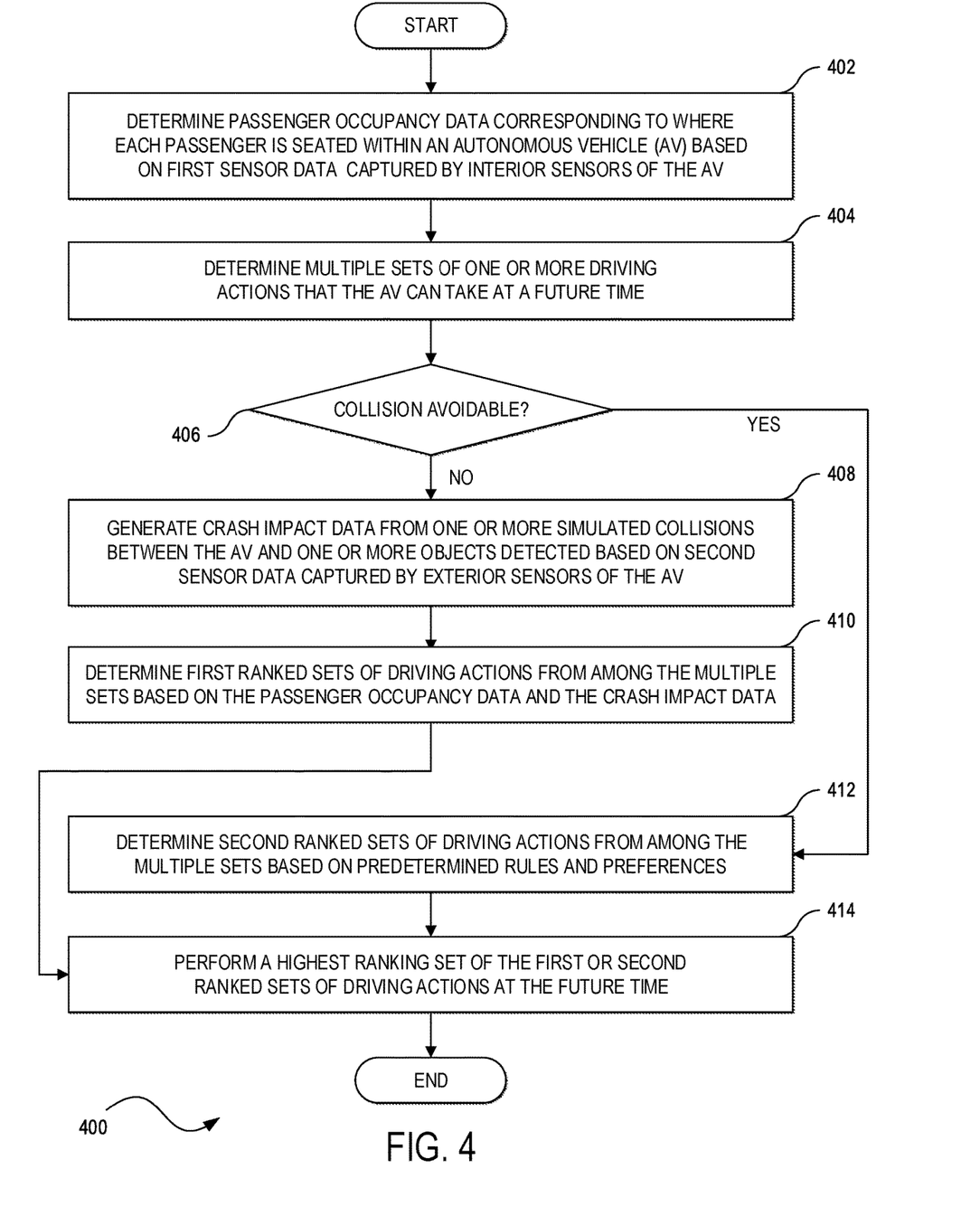
FIG. 4 illustrates a flow chart of an example of a process for improving passenger safety for an AV based on the integration of sensor data captured by the AV's interior and exterior sensors in accordance with an embodiment.

FIG. 4 illustrates a flow diagram of an example of a process 400 for improving passenger safety for the AV 102 based on the integration of sensor data captured by the AV's sensor systems 104 and 106 and interior sensor system 108. One of ordinary skill will understood that, for any flow, method, or process discussed herein, there can be additional, fewer, or alternative steps performed in similar or alternative orders, or in parallel, within the scope of the various embodiments unless otherwise stated.

The process 400 can begin with step 402 in which the AV 102 can determine passenger occupancy data corresponding to where each passenger is seated within the AV 102 from first sensor data captured by the interior sensor system 108. For example, the interior sensor system 108 can comprise one or more cameras, such as arranged in FIGS. 3A-4D or other configuration such that the cameras can capture image data of each passenger, if any, seated within the AV 102. The AV 102 can use various computer vision techniques, such as object detection, face detection, human detection, and so forth to determine whether a given seat in the AV 102 is occupied with a passenger.

In some embodiments, the AV 102 can use a 1×n vector where n can represent the number of seats inside the AV 102, 0's can indicate seat positions that are unoccupied by passengers, and 1's can indicate seat positions that are occupied. In other embodiments, the AV 102 may utilize a more complex encoding for the passenger occupancy data, such as more granular position data (e.g., two-dimensional or three-dimensional bounding box data, full mesh data representing the passenger body, etc.), passengers' demographic traits (e.g., the passenger's age, gender, height, weight, etc.), additional state data for each seat (e.g., whether the passenger has a seatbelt on, whether and to what extent a seat occupied by a passenger is reclined, etc.), and so forth.

Alternatively or in addition, the interior sensor system 108 can comprise other types of sensors capable of detecting whether a seat is occupied by a passenger, such as one or more microphones, weight sensors, pressure sensors, seat belt tension sensors, and so forth. The AV 102 can analyze output from the microphones to identify a location or spatial positioning (e.g., a distance and/or orientation) of the passenger relative to the microphones. In some embodiments, multiple microphones may be configured in an array to function as a beam former. As known to those skilled in the art, a beam former can capture audio data to determine location information of the passenger. In some embodiments, the AV 102 may analyze the audio data captured the microphones to identify other physiological evidence that a passenger is seated in a given seat, such as to detect respiration, heartbeats, and so forth.

The weight sensors, pressure sensors, and seat belt tension sensors can form a part of an occupant classification system of the AV 102. The AV 102 can utilize weight sensors or pressure sensors located beneath each seat of the AV 102 to detect whether a passenger is sitting on the seat. The seat belt tension sensors can detect when a seat belt is engaged or disengaged, and this can also be an indicator of whether a passenger is seated in a seat corresponding to that seat belt. In some embodiments, two or more types of sensors (e.g., image/video, audio, weight, pressure, tension, etc.) for detecting passenger occupancy may be combined. For example, the AV 102 can use data captured by multiple sensors and Bayes' rule to estimate the probability of passenger presence given the multiple sensor data.

At step 404, the AV 102 can determine multiple sets of one or more driving actions that the AV 102 can perform at a future time. For example, the AV 102 can receive location, speed, and direction data of the AV 102 (e.g., via the localization service 200), map or route information (e.g., via the mapping service 202, the routing service 204, the remote computing system 150, etc.), data regarding other objects on the road with the AV 102 or events occurring around the AV 102 (e.g., via the perception service 206), traffic rules and other safety standards or practices for the road (e.g., via the rules engine 208), whether the turn signal has been activated (e.g., via the signaling service 214), and so forth. The AV 102 can process the data and determine the multiple sets of driving actions that the AV 102 can perform at the future time (e.g., via the driving actions service 210).

The multiple sets of driving actions can correspond to actions for changing to a specific lane, actions for navigating the AV (e.g., going straight, turning left, turning right, stopping, etc.), actions for accelerating, decelerating, or maintaining the same speed, actions for handling driving blockages (e.g., honking the horn, high-beaming, going around the blockage, etc.), actions to drive to specific locations for picking up or dropping off passengers, actions to dwell at certain locations for specified periods of time, actions for taking alternative routes to a pick-up or drop-off location, or other actions for controlling the mechanical systems 130-138.

The process 400 may then proceed to decision block 406 in which the AV 102 can determine whether a collision is avoidable at the future time. If the collision is unavoidable, the process can proceed to step 408 in which the AV 102 can generate crash impact data. For example, the AV 102 can simulate one or more collisions occurring between the AV and one or more objects detected by second sensor data captured by the exterior sensor systems 104 and 106 when the AV performs one or more of the multiple sets of driving actions determined at step 404 and compute the effects of the simulated collisions (e.g., via the crash impact service 220) corresponding to where each passenger is seated in the AV 102. The crash impact data can include the Principal Directions of Force (PDOFs) for the simulated collisions, vehicle-based crash severity metrics (e.g., Vehicle change in velocity (Delta-V), Occupant Impact Velocity (OIV), Occupant Load Criterion (OLC), Acceleration Severity Index (ASI), Vehicle Pulse Index (VPI), etc.), injury severity metrics (e.g., Abbreviated Injury Scale (AIS), Injury Severity Score (ISS), Head Injury Criterion (HCI), chest acceleration, peak chest displacement, peak pelvic acceleration), and so forth. The crash or injury severity metrics can include an aggregate metric (e.g., applicable to the entirety of the AV 102 or a passenger seated anywhere within the AV 102) and/or individual metrics specific to where each passenger is detected within the AV (e.g., a respective crash or injury severity metric for a passenger seated in the driver's seat, the front passenger seat, the left rear passenger seat, the middle rear passenger seat, the right rear passenger seat, etc.).

The process can continue to step 410 in which the AV can determine, from among the multiple sets of driving actions determined at step 404, first ranked sets of driving actions based on the passenger occupancy data and the crash impact data (e.g., via the multiplexer service 212). For example, the AV 102 may detect one or more passengers in the front seats of the AV 102 and predict a collision with another car is unavoidable, such as if the other car drifts into oncoming traffic or the other car travels in the wrong direction of a one-way street and drives directly towards the AV 102. The AV 102 may determine that the sets of driving actions consist of sharply veering left and colliding at a left offset oblique angle, sharply veering right and colliding at a right offset oblique angle, or going straight and colliding full frontally with the other car. If the other car is driving at a high speed, the AV 102 may determine that the greatest impact to the AV and/or the greatest amount of harm to the passengers will occur if the AV goes straight, the next greatest impact to the AV and/or the next greatest amount of harm will occur by sharply veering left, and the least impact to the AV and/or the least amount of harm will occur at the left side of the AV 102 by sharply veering right. The AV 102 may determine the ranked sets of driving actions to mitigate the collision is to sharply veer right, sharply veer left, and going straight.

In another scenario, if there is only one passenger sitting in the front seat and s/he is seated on the left side of the AV 102, the AV 102 may determine the ranked sets of driving actions to best mitigate the collision is to sharply veer left and be struck on the right side with the least amount of force to where the passenger is seated, brake and be struck head-on but with less force to where the passenger is seated because of the crumpling of the front of the AV 102, and sharply veer right and be struck on the left side with the greatest amount of force to where the passenger is seated. In yet another scenario, if sharply veering left results in the AV 102 falling off the road at a great height with the greatest amount of harm to the passenger, the AV 102 may determine the ranked sets of driving actions to best mitigate the collision is to sharply veer right, go straight, and sharply veer left.

The process 400 may conclude at step 414 in which the AV 102 can perform, at the future time, a highest ranking set of driving actions among the first ranked sets of driving actions (e.g., via the mechanical controls service 216). Thus, although the AV 102 may not be able to avoid a collision under some rare circumstances through no fault of the AV itself, the AV 102 can nevertheless eliminate or mitigate harm to any passengers in the AV 102 by accounting for where the passengers are seated in the AV 102 and performing the set of driving actions predicted to cause the least amount of harm to the passengers.

Returning to the decision block 406, if the AV 102 determines there are one or more sets of driving actions that the AV 102 can take at the future time that avoids a collision, the process 400 may proceed to step 412 in which the AV 102 can determine second ranked sets of driving actions (e.g., via the multiplexer service 212) from among the multiple sets of driving actions determined at step 404 based on various predetermined rules and preferences (e.g., as set forth in the rules engine 208), such as lane preferences, route preferences, the goals of the AV ridesharing service, user preferences for a trip, and so forth. The process 400 can conclude at step 414 in which the AV 102 can perform, at the future time, a highest ranking set of driving actions among the second ranked sets of driving actions (e.g., via the mechanical controls service 216).

Figure 5:
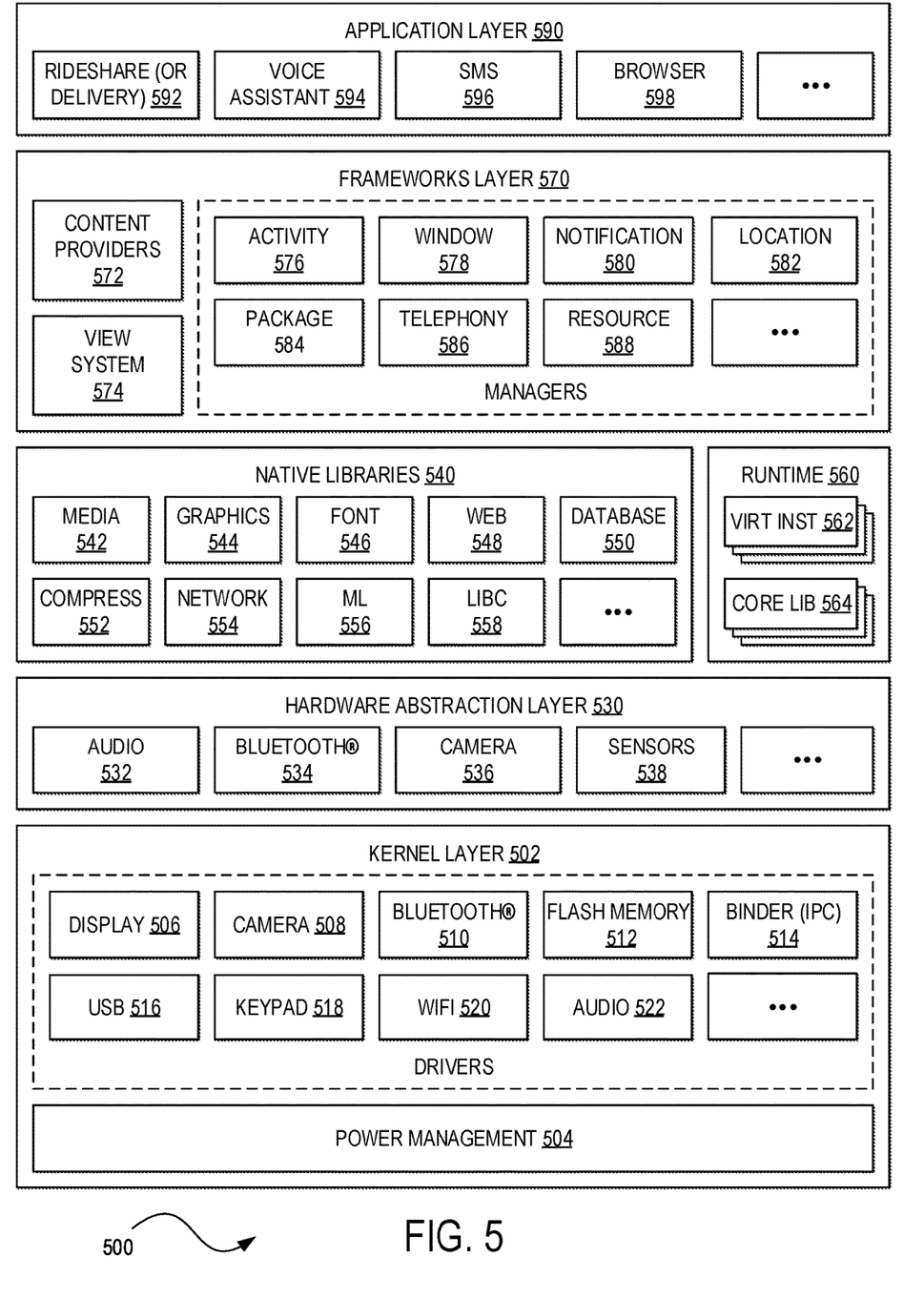
FIG. 5 illustrates an example of a software architecture for a computing system in accordance with an embodiment.

FIG. 5 illustrates an example of a software architecture 500 for a mobile computing device, such as a tablet computer, a mobile phone, a wearable device (e.g., a smart watch, smart glasses or other head-mounted display (HMD), smart ear pods or other in-ear, on-ear, or over-ear device, etc.), and so forth. Although the software architecture 500 is particularly suitable for a mobile computing device, one of ordinary skill in the art will understand that other embodiments may employ other software architectures suitable for computing devices of other form factors.

The software architecture 500 may be conceptualized as a stack of layers in which each layer provides particular functionality. For example, the software architecture 500 may include layers such as a kernel layer 502, a hardware abstraction layer 530, native libraries 540, a runtime engine 560, a frameworks layer 570, and an applications layer 590. Operationally, applications of the applications layer 590 and/or other modules/components in the other layers may invoke Application Programming Interface (API) calls through the software stack and receive a response, returned values, and so forth, as messages. The layers illustrated are representative in nature and not all software architectures have all layers. For example, some mobile or special-purpose operating systems may not provide a frameworks layer 570, while others may provide such a layer. Other software architectures may include additional or different layers.

The foundation of the software architecture 500 is the kernel layer 502, which can provide operating system functionalities, such as power management 504, low-level memory management (not shown), process management (e.g., scheduling, threading, etc.) (not shown), networking (not shown), security (not shown), logging (not shown), and so forth. In addition, the kernel layer 502 may include a driver model to enable device manufacturers to develop hardware drivers for a common, well-known kernel. For example, the kernel layer 502 may include one more display drivers 506, camera drivers 508, Bluetooth® drivers 510, Flash memory drivers 512, binder (Inter-Process Communications (IPC) drivers 514, serial communication drivers (e.g., USB) 516, keypad drivers 518, Wi-Fi drivers 520, and audio drivers 522, among others, depending on the hardware configuration. In some embodiments, the kernel layer 502 may be based on the open-source Linux® kernel.

The hardware abstraction layer 530 can provide standard interfaces that expose device hardware capabilities to higher-level layers of the software architecture 500, such as the native libraries 540, the runtime engine 560, the frameworks layer 570, and so forth. The hardware abstraction layer 530 can comprise multiple modules, each of which can implement an interface for a specific type of hardware component, such as an audio module 532, a Bluetooth® module 534, a camera module 536, and a sensors module 538, among others. When a component of a higher-level layer makes a call to access device hardware, the module for that hardware can be loaded.

In some embodiments, some of the components of the software architecture 500, such as the hardware abstraction layer 530 and the runtime engine 560, may be built from code that require native libraries written in a programming language, such as C and C++. Higher-level layers, such as the frameworks layer 570, may expose the functionality of some of these native libraries to applications of the applications layer 590. In this example, the native libraries 540 may include one or more media framework libraries 542 (e.g., Native Media APIs and/or other libraries to support presentation and manipulation of various media formats, such as Moving Picture Experts Group (MPEG) 4 (MPEG-4 or MP4), H.264, MPEG 3 (MP3), Advanced Audio Coding (AAC), Adaptive Multi-Rate (AMR), Joint Photographic Experts Group (JPEG or JPG), Portable Network Graphics (PNG), etc.), graphics rendering libraries 544 (e.g., Open Graphics Library (OpenGL®), Scalable Graphics Library (SGL), etc.), font rendering libraries 546 (e.g., FreeType), webpage rendering libraries 548 (e.g., WebKit), database management libraries 550 (e.g., Structured Query Language), data compression libraries 552 (e.g., zlib), networking libraries 554 (e.g., Secure Sockets Layer (SSL), Native Multinetwork APIs, etc.), machine learning libraries 556 (e.g., Neural Networks API), and libc 558 (e.g., C standard library for providing memory allocation functions, string manipulation functions, mathematic functions, etc.). The native libraries 540 may also include a wide variety of other libraries to provide other native APIs to the elements of the frameworks layer 570, applications layer 590, and other software components/modules.

In some embodiments, each application executing in the software architecture 500 can run in its own process within its own virtual instance 562 (e.g., virtual machine, container, etc.) of the runtime engine 560. The runtime engine 560 may run multiple virtual instances by executing byte code files, such as Dalvik Executable (DEX) files or other format designed for mobile computing devices (e.g., optimized for minimal memory utilization). Some of the features of the runtime engine 560 can include ahead-of-time and just-in-time compilation, optimized garbage collection, conversion of byte code into more compact machine code, and advanced debugging support (e.g., dedicated sampling profiler, detailed diagnostic exceptions and crash reporting, watchpoints for monitoring specific fields, etc.). The runtime engine 560 can also include core libraries 564 for providing interoperability between a particular programming language and the virtual instance 562, and expose the core APIs for that programming language, including data structures, utilities, file access, network access, and graphics, among others.

The frameworks layer 570 can comprise a set of services through which applications of the applications layer 590 interact. These services can manage the basic functions of a mobile computing device, such as resource management, voice call management, and data sharing, among others. In this example, the frameworks layer includes content providers 572, a view system 574, and a number of managers. The content providers 572 can enable applications to access data from other applications, such as a contacts application (not shown) or a calendar application (not shown), and to share their own data. The view system 574 can be used to build an application's user interface, including lists, grids, text boxes, buttons, an embeddable web browser, and so forth. The managers can include an activity manager 576, a window manager 578, a notification manager 580, a location manager 582, a package manager 584, a telephony manager 586, and a resource manager 588, among others. The activity manager 576 can control the activity life cycle of applications and can provide a common navigation back stack. The window manager 578 can be responsible for organizing contents of a display screen of a mobile computing device. The notification manager 580 can allow applications to display customs alerts and notifications. The location manager 582 can provide for location services, such as determining the location of a mobile computing device by a Global Positioning System (GPS), a cellular network, a Wi-Fi network, or other location system. The package manager 584 can enable the applications of the application layer 590 to determine information about other applications currently installed on a device. The telephony manager 586 can be responsible for voice calls. The resource manager 588 can provides access to various types of non-code resources, such as localized strings, graphics, user interface layouts, and so forth.

The frameworks layer 570 can also include various hardware device managers not shown in the software architecture 500, such as one or more camera managers, Bluetooth® managers, Wi-Fi managers, USB managers, and sensor managers (e.g., gyroscopes, accelerometers, magnetometers, proximity sensors, temperature sensors, light sensors, pressure sensors, humidity sensors, etc.), among others.

Located at the top of the software architecture 500 is the applications layer 590, which can comprise various applications, such as a ridesharing application 592, a voice assistant application 594, a Short Messaging Service (SMS) application 596, a web browser 598, and so forth.

Figure 6A:
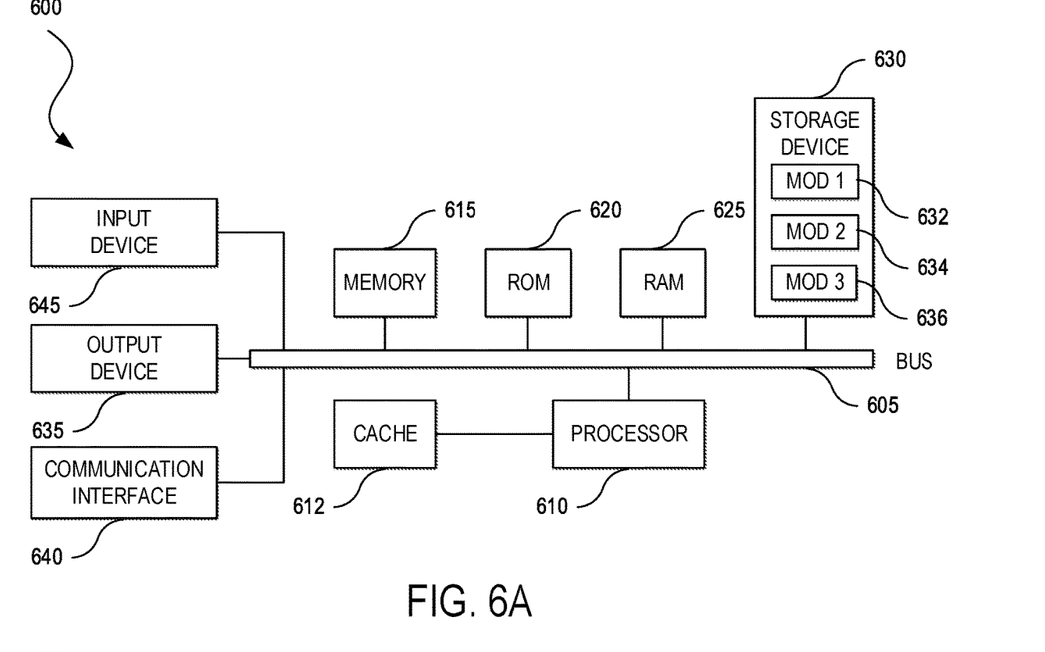
FIGS. 6A and 6B illustrate examples of computing systems in accordance with some embodiments.
Figure 6B:
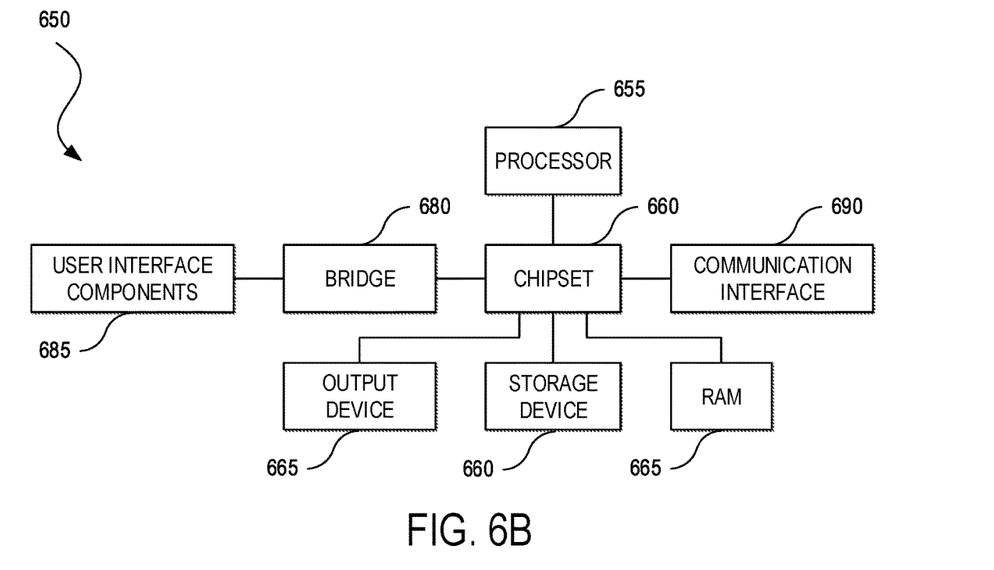

FIG. 6A and FIG. 6B illustrate systems in accordance with various embodiments. The more appropriate system will be apparent to those of ordinary skill in the art when practicing the various embodiments. Persons of ordinary skill in the art will also readily appreciate that other systems are possible.

FIG. 6A illustrates an example of a bus computing system 600 wherein the components of the system are in electrical communication with each other using a bus 605. The computing system 600 can include a processing unit (CPU or processor) 610 and a system bus 605 that may couple various system components including the system memory 615, such as read only memory (ROM) 620 and random access memory (RAM) 625, to the processor 610. The computing system 600 can include a cache 612 of high-speed memory connected directly with, in close proximity to, or integrated as part of the processor 610. The computing system 600 can copy data from the memory 615, ROM 620, RAM 625, and/or storage device 630 to the cache 612 for quick access by the processor 610. In this way, the cache 612 can provide a performance boost that avoids processor delays while waiting for data. These and other modules can control the processor 610 to perform various actions. Other system memory 615 may be available for use as well. The memory 615 can include multiple different types of memory with different performance characteristics. The processor 610 can include any general purpose processor and a hardware module or software module, such as module 1 632, module 2 634, and module 3 636 stored in the storage device 630, configured to control the processor 610 as well as a special-purpose processor where software instructions are incorporated into the actual processor design. The processor 610 may essentially be a completely self-contained computing system, containing multiple cores or processors, a bus, memory controller, cache, etc. A multi-core processor may be symmetric or asymmetric.

To enable user interaction with the computing system 600, an input device 645 can represent any number of input mechanisms, such as a microphone for speech, a touch-protected screen for gesture or graphical input, keyboard, mouse, motion input, speech and so forth. An output device 635 can also be one or more of a number of output mechanisms known to those of skill in the art. In some instances, multimodal systems can enable a user to provide multiple types of input to communicate with the computing system 600. The communications interface 640 can govern and manage the user input and system output. There may be no restriction on operating on any particular hardware arrangement and therefore the basic features here may easily be substituted for improved hardware or firmware arrangements as they are developed.

The storage device 630 can be a non-volatile memory and can be a hard disk or other types of computer readable media which can store data that are accessible by a computer, such as magnetic cassettes, flash memory cards, solid state memory devices, digital versatile disks, cartridges, random access memory, read only memory, and hybrids thereof.

As discussed above, the storage device 630 can include the software modules 632, 634, 636 for controlling the processor 610. Other hardware or software modules are contemplated. The storage device 630 can be connected to the system bus 605. In some embodiments, a hardware module that performs a particular function can include a software component stored in a computer-readable medium in connection with the necessary hardware components, such as the processor 610, bus 605, output device 635, and so forth, to carry out the function.

FIG. 6B illustrates an example architecture for a chipset computing system 650 that can be used in accordance with an embodiment. The computing system 650 can include a processor 655, representative of any number of physically and/or logically distinct resources capable of executing software, firmware, and hardware configured to perform identified computations. The processor 655 can communicate with a chipset 660 that can control input to and output from the processor 655. In this example, the chipset 660 can output information to an output device 665, such as a display, and can read and write information to storage device 670, which can include magnetic media, solid state media, and other suitable storage media. The chipset 660 can also read data from and write data to RAM 675. A bridge 680 for interfacing with a variety of user interface components 685 can be provided for interfacing with the chipset 660. The user interface components 685 can include a keyboard, a microphone, touch detection and processing circuitry, a pointing device, such as a mouse, and so on. Inputs to the computing system 650 can come from any of a variety of sources, machine generated and/or human generated.

The chipset 660 can also interface with one or more communication interfaces 690 that can have different physical interfaces. The communication interfaces 690 can include interfaces for wired and wireless Local Area Networks (LANs), for broadband wireless networks, as well as personal area networks. Some applications of the methods for generating, displaying, and using the technology disclosed herein can include receiving ordered datasets over the physical interface or be generated by the machine itself by the processor 655 analyzing data stored in the storage device 670 or the RAM 675. Further, the computing system 650 can receive inputs from a user via the user interface components 685 and execute appropriate functions, such as browsing functions by interpreting these inputs using the processor 655.

It will be appreciated that computing systems 600 and 650 can have more than one processor 610 and 655, respectively, or be part of a group or cluster of computing devices networked together to provide greater processing capability.

For clarity of explanation, in some instances the various embodiments may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Some examples of such form factors include general purpose computing devices such as servers, rack mount devices, desktop computers, laptop computers, and so on, or general purpose mobile computing devices, such as tablet computers, smart phones, personal digital assistants, wearable devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The invention claimed is:

1. An apparatus for improving passenger safety, comprising:
   at least one memory; and
   at least one processor coupled to the at least one memory, the at least one processor configured to:
   collect, via an interior sensor system, passenger occupancy data for an autonomous vehicle (AV), wherein the passenger occupancy data comprises indications of where each of one or more passengers is positioned within the AV;
   calculate a crash severity metric for each of a plurality of driving actions that the AV can take at a future time; and
   rank each of the plurality of driving actions based on the associated crash severity metric, and wherein the crash severity metric for each of the plurality of driving actions is based on the passenger occupancy data.

2. The apparatus of claim 1, wherein the at least one processor is further configured to:
   select a set of driving actions based on the ranking of each of the plurality of driving actions, wherein the set of driving actions is not predicted to result in a collision.

3. The apparatus of claim 1, wherein the at least one processor is further configured to:
   select a set of driving actions based on the ranking of each of the plurality of driving actions, wherein the set of driving actions is predicted to minimize injury to the one or more passengers.

4. The apparatus of claim 1, wherein the interior sensor system comprises a video camera, a weight sensor, a seat belt tension sensor, or a combination thereof.

5. The apparatus of claim 1, wherein the passenger occupancy data comprises bounding box data for each of the one or more passengers within the AV.

6. The apparatus of claim 1, wherein the passenger occupancy data comprises demographic information for each of the one or more passengers within the AV.

7. The apparatus of claim 1, wherein the crash severity metrics for each of the plurality of driving actions are further based on state data indicating a seatbelt status for each of the one or more passengers within the AV.

8. A computer-implemented method for improving passenger safety, comprising:
   collecting passenger occupancy data for an autonomous vehicle (AV), wherein the passenger occupancy data comprises indications of where each of one or more passengers is positioned within the AV;
   calculating a crash severity metric for each of a plurality of driving actions that the AV can take at a future time; and
   ranking each of the plurality of driving actions based on the crash severity metric, and wherein the crash severity metric for each of the plurality of driving actions is based on the passenger occupancy data.

9. The computer-implemented method of claim 8, further comprising:
   selecting a set of driving actions based on the ranking of each of the plurality of driving actions, wherein the set of driving actions is not predicted to result in a collision.

10. The computer-implemented method of claim 8, further comprising:
    selecting a set of driving actions based on the ranking of each of the plurality of driving actions, wherein the set of driving actions is predicted to minimize injury to the one or more passengers.

11. The computer-implemented method of claim 8, wherein the passenger occupancy data is collected by a video camera, a weight sensor, a seat belt tension sensor, or a combination thereof.

12. The computer-implemented method of claim 8, wherein the passenger occupancy data comprises bounding box data for each of the one or more passengers within the AV.

13. The computer-implemented method of claim 8, wherein the passenger occupancy data comprises demographic information for each of the one or more passengers within the AV.

14. The computer-implemented method of claim 8, wherein the crash severity metrics for each of the plurality of driving actions are further based on state data indicating a seatbelt status for each of the one or more passengers within the AV.

15. A non-transitory computer-readable storage medium comprising at least one instruction for causing a computer or processor to:
    collect passenger occupancy data for an autonomous vehicle (AV), wherein the passenger occupancy data comprises indications of where each of one or more passengers is positioned within the AV;
    calculate a crash severity metric for each of a plurality of driving actions that the AV can take at a future time; and
    rank each of the plurality of driving actions based on the crash severity metric, and wherein the crash severity metric for each of the plurality of driving actions is based on the passenger occupancy data.

16. The non-transitory computer-readable storage medium of claim 15, wherein the at least one processor is further configured to:
    select a set of driving actions based on the ranking of each of the plurality of driving actions, wherein the selected set of driving actions is not predicted to result in a collision.

17. The non-transitory computer-readable storage medium of claim 15, wherein the at least one instruction is further configured to cause the computer or processor to:
    select a set of driving actions based on the ranking of each of the plurality of driving actions, wherein the set of driving actions is predicted to minimize injury to the one or more passengers.

18. The non-transitory computer-readable storage medium of claim 15, wherein the passenger occupancy data is received from a video camera, a weight sensor, a seat belt tension sensor, or a combination thereof.

19. The non-transitory computer-readable storage medium of claim 15, wherein the passenger occupancy data comprises bounding box data for each of the one or more passengers within the AV.

20. The non-transitory computer-readable storage medium of claim 15, wherein the passenger occupancy data comprises demographic information for each of the one or more passengers within the AV.

* * * * *